(12) United States Patent
Wu (10) Patent No.: US 8,115,320 B2
(45) Date of Patent: Feb. 14, 2012

(54) BOND PAD STRUCTURE LOCATED OVER ACTIVE CIRCUIT STRUCTURE

(75) Inventor: Ping-Chang Wu, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 546 days.

(21) Appl. No.: 12/129,333

(22) Filed: May 29, 2008

(65) Prior Publication Data
US 2009/0294994 A1   Dec. 3, 2009

(51) Int. Cl.
*H01L 23/485* (2006.01)
(52) U.S. Cl. ........... 257/780; 257/E23.02; 257/E23.011; 257/758; 257/784; 257/786; 257/734; 257/781
(58) Field of Classification Search .................. 257/780, 257/758, E23.02, E23.011, 784, 786, 734, 257/781
See application file for complete search history.

(56) References Cited

U.S. PATENT DOCUMENTS

| | | | |
|---|---|---|---|
| 6,900,541 B1 | 5/2005 | Wang et al. | |
| 7,056,820 B2 | 6/2006 | Cole et al. | |
| 7,071,575 B2 * | 7/2006 | Wu et al. ....................... | 257/786 |
| 7,208,837 B2 | 4/2007 | Wang et al. | |
| 7,276,435 B1 | 10/2007 | Pozder et al. | |
| 7,372,168 B2 * | 5/2008 | Wu et al. ....................... | 257/784 |
| 2001/0045631 A1 * | 11/2001 | Kinsman ....................... | 257/676 |
| 2005/0178582 A1 | 8/2005 | Lee et al. | |
| 2006/0103031 A1 * | 5/2006 | Wu ................................ | 257/781 |
| 2006/0180946 A1 * | 8/2006 | Chen ............................. | 257/786 |
| 2006/0207790 A1 * | 9/2006 | Choi ............................. | 174/262 |
| 2006/0226547 A1 | 10/2006 | Wang et al. | |
| 2006/0292711 A1 | 12/2006 | Su et al. | |
| 2007/0042593 A1 * | 2/2007 | Lee et al. ...................... | 438/613 |
| 2007/0205508 A1 * | 9/2007 | Hsia et al. .................... | 257/734 |
| 2008/0122085 A1 * | 5/2008 | Kanaoka et al. ............. | 257/737 |
| 2008/0203577 A1 * | 8/2008 | Fukamizu et al. ........... | 257/773 |
| 2010/0159690 A1 * | 6/2010 | Kasaoka et al. .............. | 438/612 |

FOREIGN PATENT DOCUMENTS

| | | |
|---|---|---|
| TW | I238510 | 8/2005 |
| TW | I247565 | 1/2006 |

OTHER PUBLICATIONS

TW OA, Oct. 31, 2011.

* cited by examiner

*Primary Examiner* — A O Williams
(74) *Attorney, Agent, or Firm* — WPAT., P.C.; Justin King (57) ABSTRACT

A bond pad structure located over an active circuit structure is disclosed. The bond pad structure includes a bond pad, a passivation layer and a topmost metal layer in the active circuit structure. The passivation layer covers the bond pad and has an opening, and the opening exposes a part of the bond pad. The part of the topmost metal layer located under the opening serves as a supporting layer. The supporting layer has at least a slot, and the topmost metal layer is electrically connected to the bond pad through a plurality of via plugs.

26 Claims, 9 Drawing Sheets

BOND PAD STRUCTURE LOCATED OVER ACTIVE CIRCUIT STRUCTURE

BACKGROUND OF THE INVENTION

1. Field of the Invention

The present invention generally relates to a bond pad structure, and more particularly, to a bond pad structure located over an active circuit structure.

2. Description of Related Art

Along with the higher and higher integration of an integrated circuit (IC), the area of an IC chip is a very significant factor which affects the cost thereof. The larger the area of a chip, the higher the IC cost is. For the IC, an I/O circuit, an electrostatic discharge protection circuit and a bond pad structure also occupy certain areas. These areas may be even larger than the area of the active circuit structure itself in some circumstances.

In general, the bond pad structure is located on the periphery region of the above-mentioned I/O circuit. In order to largely reduce the chip area and the production cost, in the prior art, a technique has been developed, where a bond pad structure, an I/O circuit and an active circuit structure are formed on a same region by using a process technology, and such a technique is termed as BOAC technique (bond pad structure over active circuit structure).

During a wiring process on a bond pad structure, the bond pad may be fractured or peeled from a dielectric layer due to the impacts caused by a wiring press process or a wiring pull process, which further results in the poor conductance of the product. To solve this problem of the prior art, a metal layer for supporting is formed under the bond pad. Although a bond pad structure employs more metal layers for supporting, the strength of the bond pad structure can be enhanced, but it brings new problems of wasting space and increasing cost.

To promote the efficiency of a semiconductor device in the currently conventional semiconductor process, a material with a lower dielectric coefficient is preferably used for forming the dielectric layer. However, the dielectric layer with the lower dielectric coefficient has a weak strength, which would lower the wire pull strength of the bond pad structure and degrade the reliability. As a compromise solution, the bond pad structure employs only one metal layer for supporting. In fact, with the bond pad structure having a metal layer for supporting, the bond pad structure still has risk of being fractured or peeled from a dielectric layer and even damaging other semiconductor structures under the bond pad structure during a wiring process.

SUMMARY OF THE INVENTION

Accordingly, the present invention is directed to a bond pad structure, which may reduce the possibility of being fractured or peeled from a dielectric layer.

The present invention is also directed to a bond pad structure capable of effectively protecting the semiconductor structure under the bond pad.

The present invention provides a bond pad structure located over an active circuit structure. The bond pad structure includes a bond pad, a passivation layer and a topmost metal layer in the active circuit structure. The passivation layer covers the bond pad and has an opening, and the opening exposes a portion of the bond pad. The part of the topmost metal layer under the opening serves as a supporting layer. The supporting layer has at least a slot. The topmost metal layer is electrically connected to the bond pad through a plurality of via plugs.

According to an embodiment of the present invention, in the above-mentioned bond pad structure, the pattern of the supporting layer is at least two bar patterns, for example.

According to an embodiment of the present invention, in the above-mentioned bond pad structure, the bar patterns are arranged, for example, parallel to each other.

According to an embodiment of the present invention, in the above-mentioned bond pad structure, the bar patterns are connected to each other, for example.

According to an embodiment of the present invention, in the above-mentioned bond pad structure, the pattern of the supporting layer is a spiral pattern, for example.

According to an embodiment of the present invention, in the above-mentioned bond pad structure, the pattern of the supporting layer is, for example, a grillwork pattern.

According to an embodiment of the present invention, in the above-mentioned bond pad structure, the pattern of the supporting layer is at least two ring patterns, for example.

According to an embodiment of the present invention, in the above-mentioned bond pad structure, the ring patterns are concentric ring patterns, for example.

The present invention further provides another bond pad structure located over an active circuit structure. The bond pad structure includes a bond pad, a passivation layer, a topmost metal layer in the active circuit structure and a plurality of via plugs. The bond pad includes a bonding portion and a non-bonding portion, wherein at least a portion of the bonding portion is a bonding region. The passivation layer covers the bond pad and has an opening, and the opening exposes the bonding portion of the bond pad. The topmost metal layer includes a supporting layer and a circuit layer. The supporting layer is located under the bonding region of the bond pad and has at least a slot. The circuit layer is located under the non-bonding portion of the bond pad, and the circuit layer and the supporting layer are connected to each other. The bond pad is electrically connected to the circuit layer through the via plugs.

According to another embodiment of the present invention, in the above-mentioned bond pad structure, the pattern of the supporting layer is at least two bar patterns, for example.

According to another embodiment of the present invention, in the above-mentioned bond pad structure, the bar patterns are arranged, for example, parallel to each other.

According to another embodiment of the present invention, in the above-mentioned bond pad structure, the bar patterns are connected to each other, for example.

According to another embodiment of the present invention, in the above-mentioned bond pad structure, the pattern of the supporting layer is a spiral pattern, for example.

According to another embodiment of the present invention, in the above-mentioned bond pad structure, the pattern of the supporting layer is, for example, a grillwork pattern.

According to another embodiment of the present invention, in the above-mentioned bond pad structure, the pattern of the supporting layer is at least two ring patterns, for example.

According to another embodiment of the present invention, in the above-mentioned bond pad structure, the ring patterns are concentric ring patterns, for example.

According to another embodiment of the present invention, in the above-mentioned bond pad structure, the supporting layer and the circuit layer are connected to each other.

According to another embodiment of the present invention, in the above-mentioned bond pad structure, the supporting layer and the circuit layer are not connected to each other.

According to another embodiment of the present invention, in the above-mentioned bond pad structure, the non-bonding portion is located at a side of the bonding portion.

According to another embodiment of the present invention, in the above-mentioned bond pad structure, the non-bonding portion is located at both sides of the bonding portion.

According to another embodiment of the present invention, in the above-mentioned bond pad structure, each of the bar patterns and the circuit layer located at at least one side of the bar patterns are connected to each other, for example.

According to another embodiment of the present invention, in the above-mentioned bond pad structure, an extending direction of the bar patterns and an extending direction of the bonding portion are parallel or perpendicular, for example.

According to another embodiment of the present invention, in the above-mentioned bond pad structure, the via plugs located at both sides of the bonding portion are symmetrical about the bonding portion.

According to another embodiment of the present invention, in the above-mentioned bond pad structure, the via plugs located at both sides of the bonding portion are unsymmetrical about the bonding portion.

Based on the above described, since the supporting layer in the bond pad structure provided by the present invention has at least a slot, the Young's modulus of the supporting layer is increased, which further enhances the wire pull strength of the bond pad and promotes the reliability thereof and avoids the bond pad from being fractured or peeled from the dielectric layer during a wiring process. In addition, the employed supporting layer also functions to prevent a possible harm on the semiconductor structure under the bond pad due to a wiring pressure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
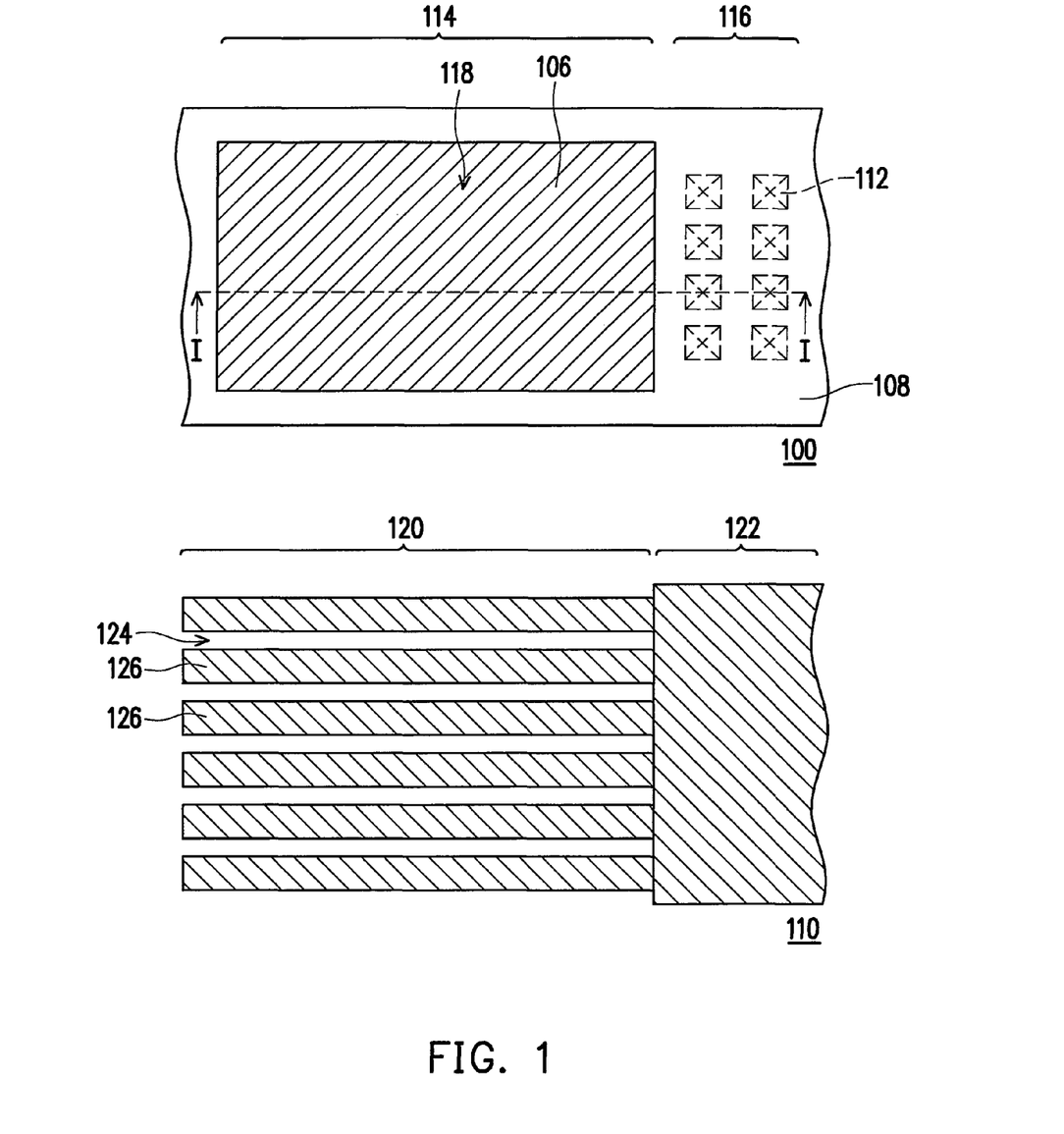
FIG. 1 is a schematic top view of a bond pad structure and a topmost metal layer according to the first embodiment of the present invention.
Figure 2:
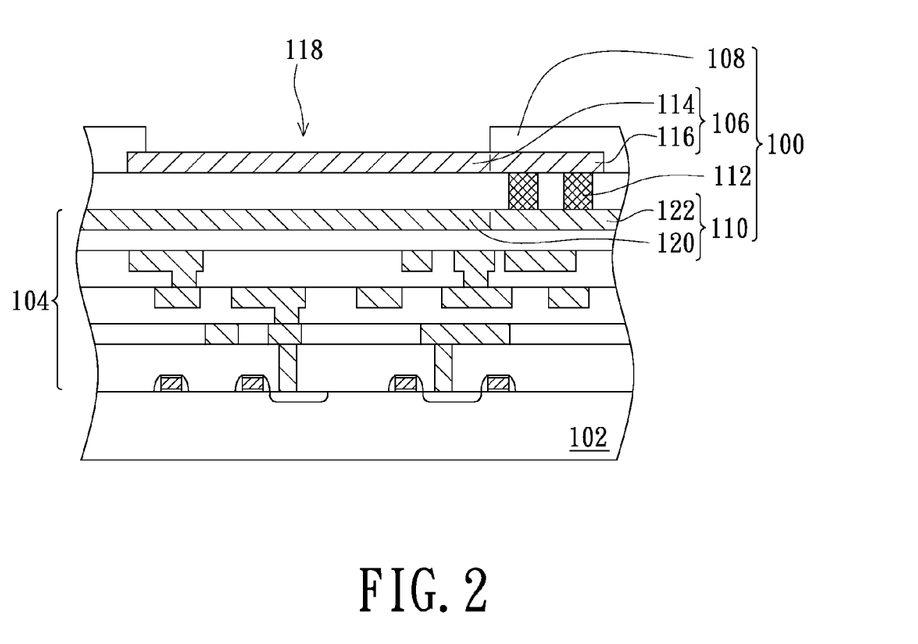
FIG. 2 is a cross-sectional diagram along the line I-I in FIG. 1.

FIG. 1 is a schematic top view of a bond pad structure and a topmost metal layer according to the first embodiment of the present invention. FIG. 2 is a cross-sectional diagram along the line I-I in FIG. 1.

Referring to FIGS. 1 and 2, a bond pad structure 100 is located over an active circuit structure 104 on a substrate 102. The bond pad structure 100 includes a bond pad 106, a passivation layer 108, a topmost metal layer 110 in the active circuit structure 104 and via plugs 112. In addition, other metal layers in the active circuit structure 104 serve for customized routing.

The bond pad 106 includes a bonding portion 114 and a non-bonding portion 116, wherein the bonding portion 114 is the portion with conducting wiring, and the non-bonding portion 116 is the portion without conducting wiring. The non-bonding portion 116 is located, for example, at one side of the bonding portion 114. The material of the bond pad 106 is, for example, a metal material such as aluminium.

In the first embodiment, the location of the non-bonding portion 116 is exemplarily defined at one side of the bonding portion 114, but it is not used for limiting the scope of the present invention. In other embodiments, the non-bonding portion 116 can be located at both sides of the bonding portion 114.

The passivation layer 108 covers the bond pad 106 so as to avoid the bond pad 106 from contacting exterior to cause contamination, metal oxidation or damage. The passivation layer 108 has an opening 118 to expose the bonding portion 114 of the bond pad 106. The material of the passivation layer 108 comprises, for example, silicon oxide, silicon nitride or other dielectric materials.

The topmost metal layer 110 includes a supporting layer 120 and a circuit layer 122. The material of the topmost metal layer 110 comprises, for example, a metal material such as copper. The supporting layer 120 is located under the bonding portion 114 of the bond pad 106, wherein the bonding portion 114 is exposed by the opening 118. The circuit layer 122 is located under the non-bonding portion 116 of the bond pad 106. The supporting layer 120 and the circuit layer 122 are, for example, connected to each other. In the other embodiments, the supporting layer 120 and the circuit layer 122 may be not connected to each other.

The supporting layer 120 has at least a slot 124, which functions to increase the Young's modulus of the supporting layer 120. There is no limitation on the pattern of the supporting layer 120, but the pattern of the supporting layer 120 must contain a slot 124. In the first embodiment, the pattern of the supporting layer 120 has at least two bar patterns 126 (for example, six bar patterns 126 in FIG. 1), for example, the bar patterns 126 are parallel to each other. In the embodiment, although the connection type of the circuit layer 122 and the supporting layer 120 is that each of the bar patterns 126 is connected to circuit layer 122 respectively, but it is understood that the connection type of the circuit layer 122 and the supporting layer 120 is not intended to limit the scope of this invention.

The bond pad 106 is electrically connected to the circuit layer 122 through the via plugs 112. The material of the via plugs 112 comprises, for example, a metal material such as tungsten.

It can be seen from the above-described first embodiment, since the supporting layer 120 in the bond pad structure 100 has at least a slot 124, the Young's modulus of the supporting layer 120 is accordingly increased, which further enhances the wire pull strength and promotes the reliability thereof. In this way, the possibility of fracturing the bond pad 106 or peeling the bond pad 106 from the dielectric layer during a successive wiring process may be effectively reduced. In addition, during the successive wiring process, the supporting layer 120 can also protect the semiconductor structure under the bond pad 106; moreover, a possible harm on the semiconductor structure (for example, other metal layers in the active circuit structure 104) caused by a wiring pressure can be prevented.

Figure 3:
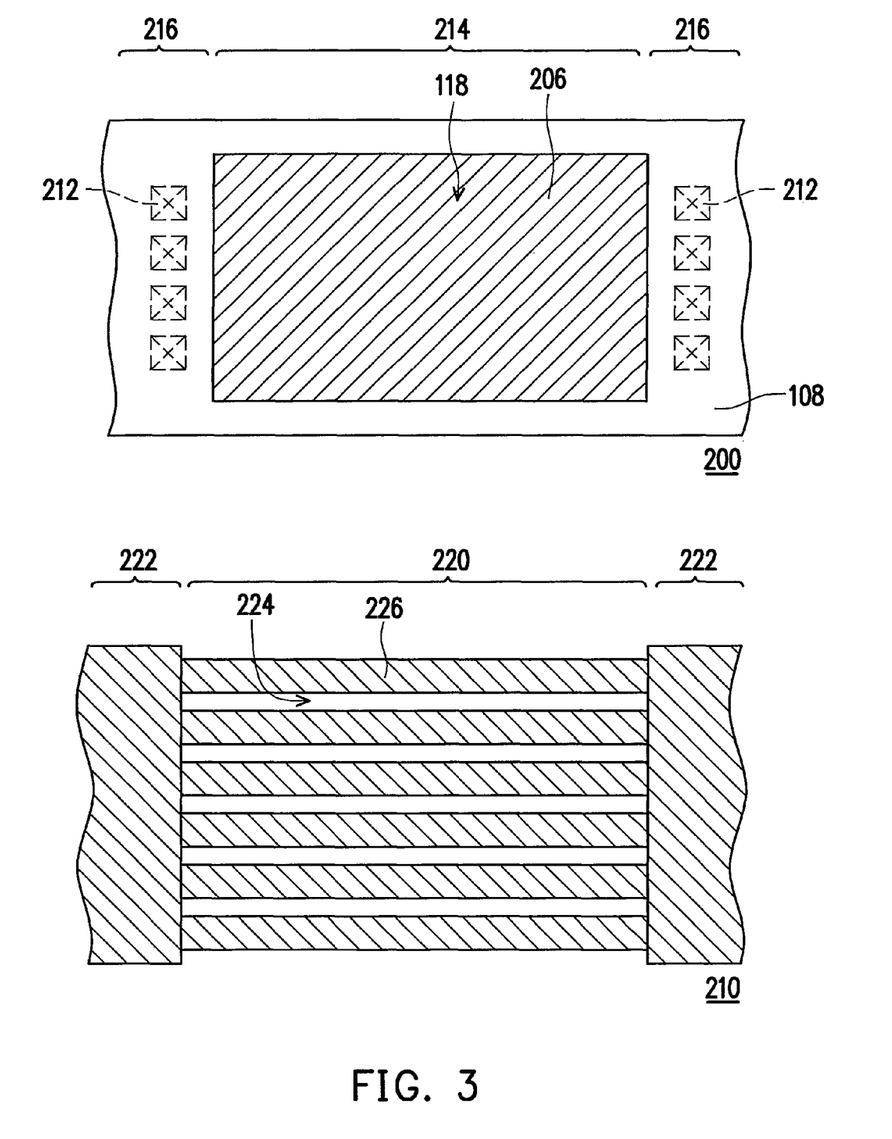
FIG. 3 is a schematic top view of a bond pad structure and a topmost metal layer according to the second embodiment of the present invention.

FIG. 3 is a schematic top view of a bond pad structure and a topmost metal layer according to the second embodiment of the present invention. Note that all the same parts in FIG. 3 to those in FIG. 1 are marked with the same notations and omitted to describe for simplicity.

Referring to FIGS. 1 and 3, the bond pad structure 200 of the second embodiment is different from the bond pad structure 100 of the first embodiment that both the non-bonding portion 116 of the bond pad 106 and the via plugs 112 in the first embodiment are located at one side of the bonding portion 114, but the non-bonding portion 216 of the bond pad 206 and the via plugs 212 in the second embodiment are respectively located at both sides of the bonding portion 214. Thus, in the topmost metal layer 210, the circuit layer 222 is located at both sides of the supporting layer 220. The supporting layer 220 and the circuit layer 222 are, for example, connected to each other. In the other embodiments, the supporting layer 220 and the circuit layer 222 can be not connected to each other too. In the embodiment, the via plugs 212 located at both sides of the bonding portion 214 are symmetrical about the bonding portion 214. In other embodiments, the via plugs 212 located at both sides of the bonding portion 214 can be unsymmetrical about the bonding portion 214. Besides, the parts of the bond pad structure 200 of the second embodiment and the similar parts of the bond pad structure 100 of the first embodiment have almost the same materials and functions, which are omitted to describe herein for simplicity.

Since the bond pad structure 200 of the second embodiment and the bond pad structure 100 of the first embodiment have the similar technical features; that is, the supporting layer 220 has at least a slot 224 located between the two bar patterns 226 of the supporting layer 220, therefore, the fracture of the bond pad 206 or the peeling problem of the bond pad 206 from the dielectric layer during a successive wiring process can be avoided, and moreover, the semiconductor structure under the bond pad 206 can be effectively protected as well.

Figure 4:
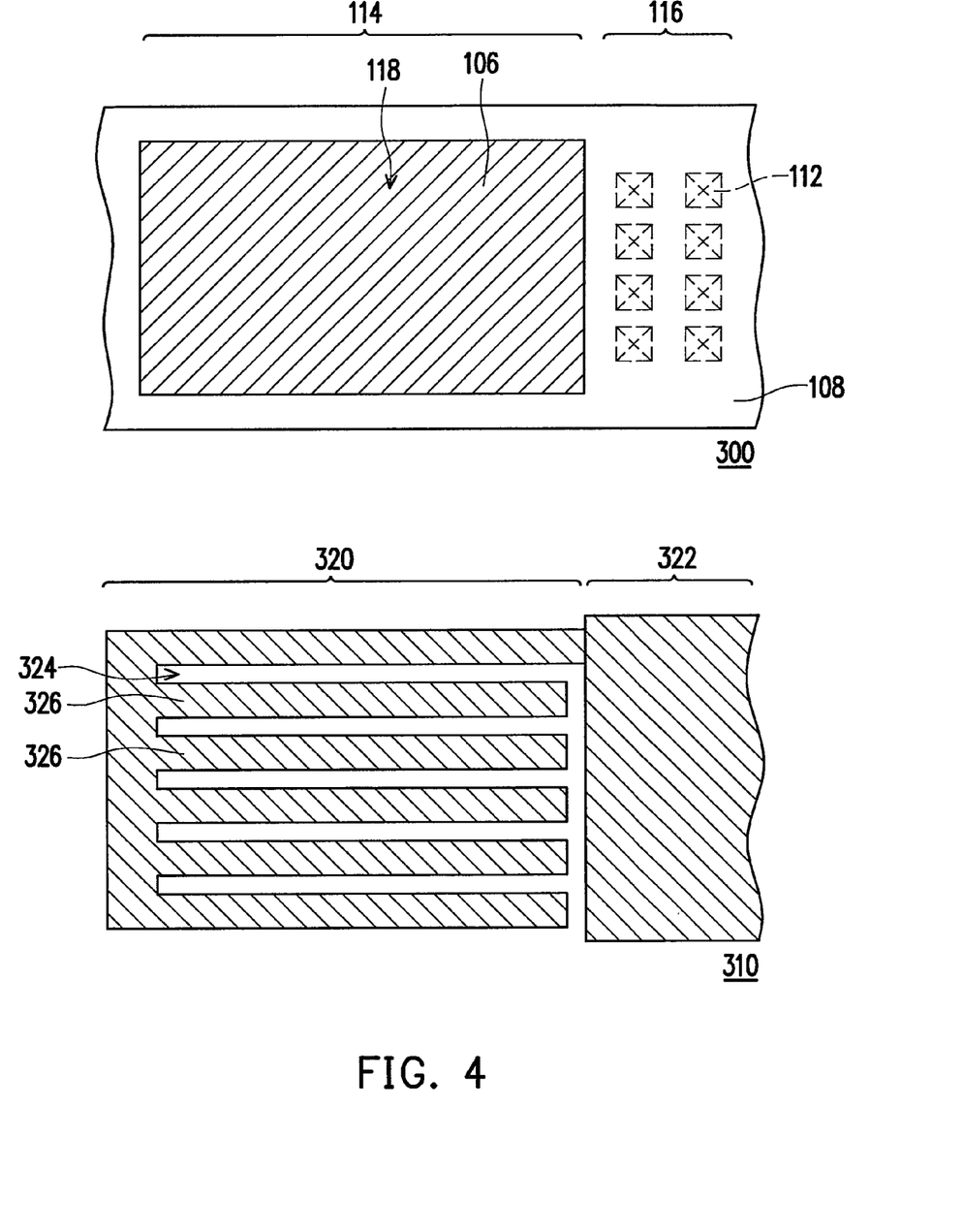
FIG. 4 is a schematic top view of a bond pad structure and a topmost metal layer according to the third embodiment of the present invention.

FIG. 4 is a schematic top view of a bond pad structure and a topmost metal layer according to the third embodiment of the present invention. Note that all the same parts in FIG. 4 to those in FIG. 1 are marked with the same notations and omitted to describe for simplicity.

Referring to FIGS. 1 and 4, the bond pad structure 300 of the third embodiment and the bond pad structure 100 in the first embodiment that have different connection types of the circuit layer and the supporting layer. In the supporting layer 120 of the topmost metal layer 110 of the first embodiment, each of the bar patterns 126 is not connected to each other and connected to the circuit layer 122 respectively. But, in the supporting layer 320 of the topmost metal layer 310 of the third embodiment, each of the bar patterns 326 is connected to each other, and one of the bar patterns 326 and the circuit layer 322 are connected to each other. In the other embodiments, the supporting layer 320 and the circuit layer 322 can be not connected to each other too. An extending direction of the bar patterns 326 and an extending direction of the bonding portion 114 are parallel, for example. In the other embodiments, the extending direction of the bar patterns 326 and the extending direction of the bonding portion 114 could be perpendicular. Besides, the parts of the bond pad structure 300 of the third embodiment and the similar parts of the bond pad structure 100 of the first embodiment have almost the same materials and functions, which are omitted to describe herein for simplicity.

Since the bond pad structure 300 of the third embodiment and the bond pad structure 100 of the first embodiment have similar technical features; that is, the supporting layer 320 has at least a slot 324 within the pattern thereof, therefore, the fracture of the bond pad 106 or the peeling problem of the bond pad 106 from the dielectric layer during a successive wiring process can be avoided, and moreover, the semiconductor structure under the bond pad 106 can be effectively protected as well.

Figure 5:
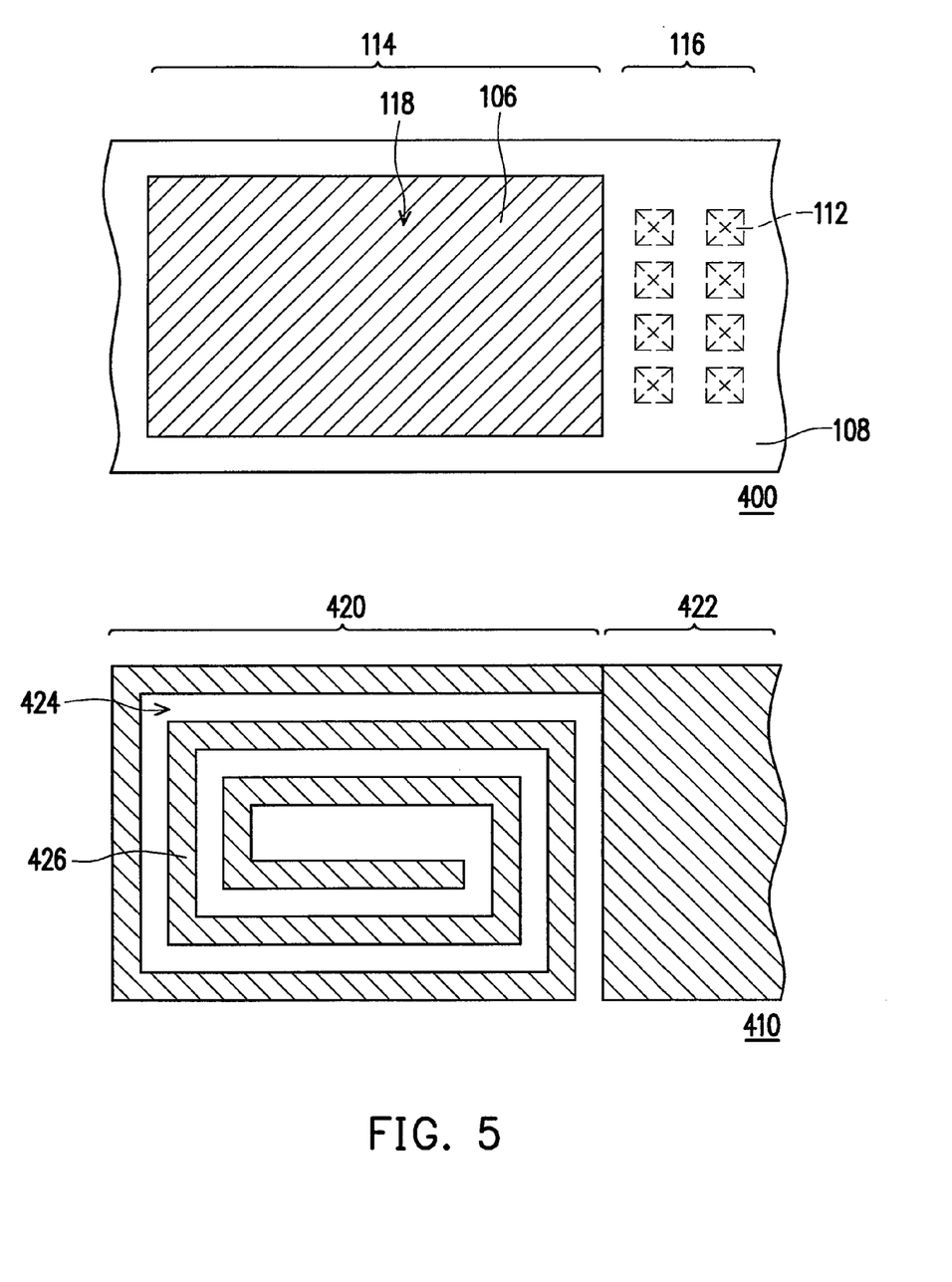
FIG. 5 is a schematic top view of a bond pad structure and a topmost metal layer according to the fourth embodiment of the present invention.

FIG. 5 is a schematic top view of a bond pad structure and a topmost metal layer according to the fourth embodiment of the present invention. Note that all the same parts in FIG. 5 to those in FIG. 1 are marked with the same notations and omitted to describe for simplicity.

Referring to FIGS. 1 and 5, the bond pad structure 400 of the fourth embodiment is different from the bond pad structure 100 of the first embodiment that the pattern of the supporting layer 120 of the topmost metal layer 110 in the first embodiment is at least two bar patterns 126 (for example, six parallel bar patterns 126 in FIG. 1); but the pattern of the supporting layer 420 of the topmost metal layer 410 of the forth embodiment is a spiral pattern 426. The supporting layer 420 of the topmost metal layer 410 is, for example, electrically connected to the circuit layer 422. In the other embodiments, the supporting layer 420 and the circuit layer 422 can be not connected to each other too. Besides, the parts of the bond pad structure 400 in the fourth embodiment and the similar parts of the bond pad structure 100 in the first embodiment have almost the same materials and functions, which are omitted to describe herein for simplicity.

Since the bond pad structure 400 of the fourth embodiment and the bond pad structure 100 of the first embodiment have the similar technical features; that is, the supporting layer 420 has at least a slot 424 within the supporting layer 420, therefore, the fracture of the bond pad 106 or the peeling problem of the bond pad 106 from the dielectric layer during a successive wiring process can be avoided, and moreover, the semiconductor structure under the bond pad 106 can be effectively protected as well.

Figure 6:
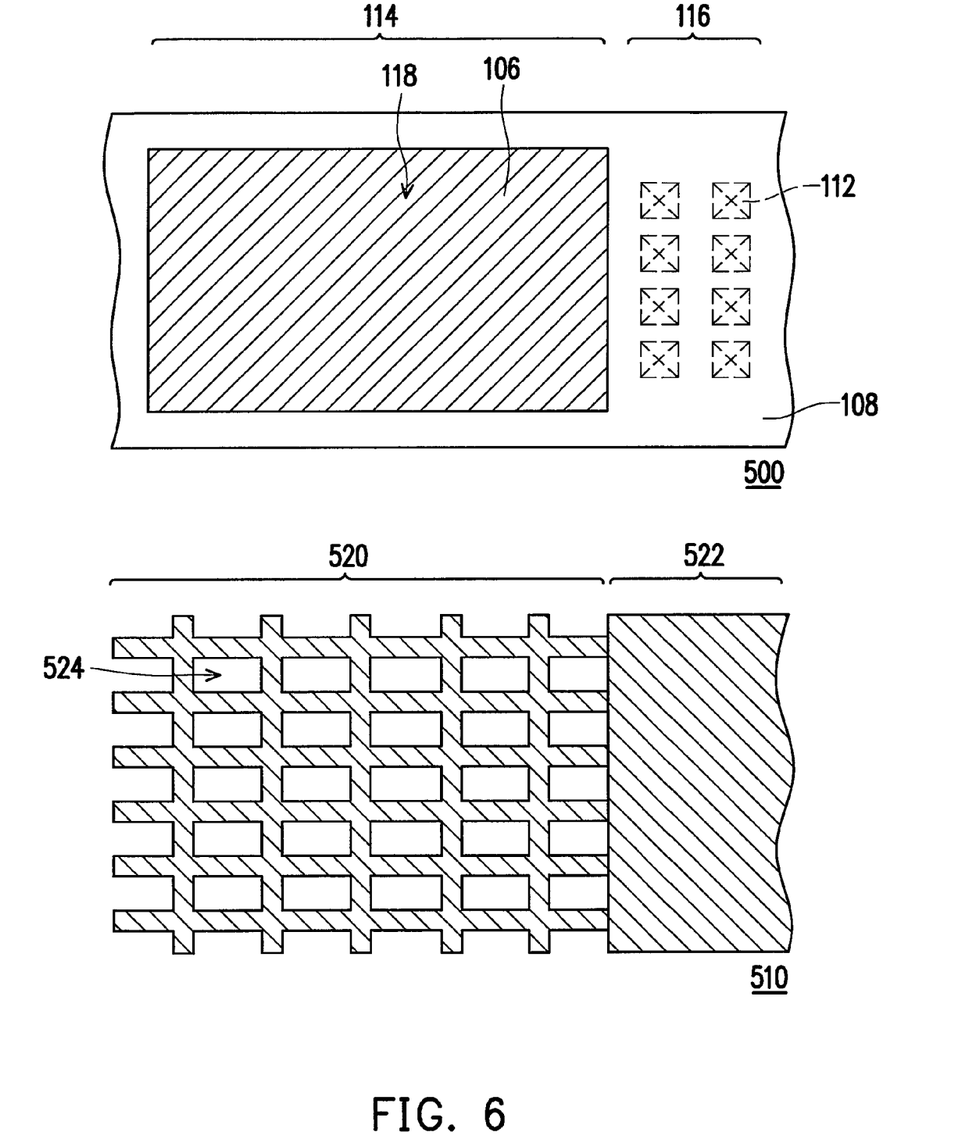
FIG. 6 is a schematic top view of a bond pad structure and a topmost metal layer according to the fifth embodiment of the present invention.

FIG. 6 is a schematic top view of a bond pad structure and a topmost metal layer according to the fifth embodiment of the present invention. Note that all the same parts in FIG. 6 to those in FIG. 1 are marked with the same notations and omitted to describe for simplicity.

Referring to FIGS. 1 and 6, the bond pad structure 500 of the fifth embodiment is different from the bond pad structure 100 of the first embodiment that the pattern of the supporting layer 120 of the topmost metal layer 110 in the first embodiment is at least two bar patterns 126 (for example, six parallel bar patterns 126 in FIG. 1); but the pattern of the supporting layer 520 of the topmost metal layer 510 in the fifth embodiment is a grillwork pattern. The supporting layer 520 of the topmost metal layer 510 is, for example, electrically connected to the circuit layer 522. In the other embodiments, the supporting layer 520 and the circuit layer 522 can be not connected to each other too. Besides, the parts of the bond pad structure 500 of the fifth embodiment and the similar parts of the bond pad structure 100 of the first embodiment have almost the same materials and functions, which are omitted to describe herein for simplicity.

Since the bond pad structure 500 of the fifth embodiment and the bond pad structure 100 of the first embodiment have the similar technical features; that is, the supporting layer 520 has at least a slot 524 within the grillwork pattern of the supporting layer 520, therefore, the fracture of the bond pad 106 or the peeling problem of the bond pad 106 from the dielectric layer during a successive wiring process can be avoided, and moreover, the semiconductor structure under the bond pad 106 can be effectively protected as well.

Figure 7:
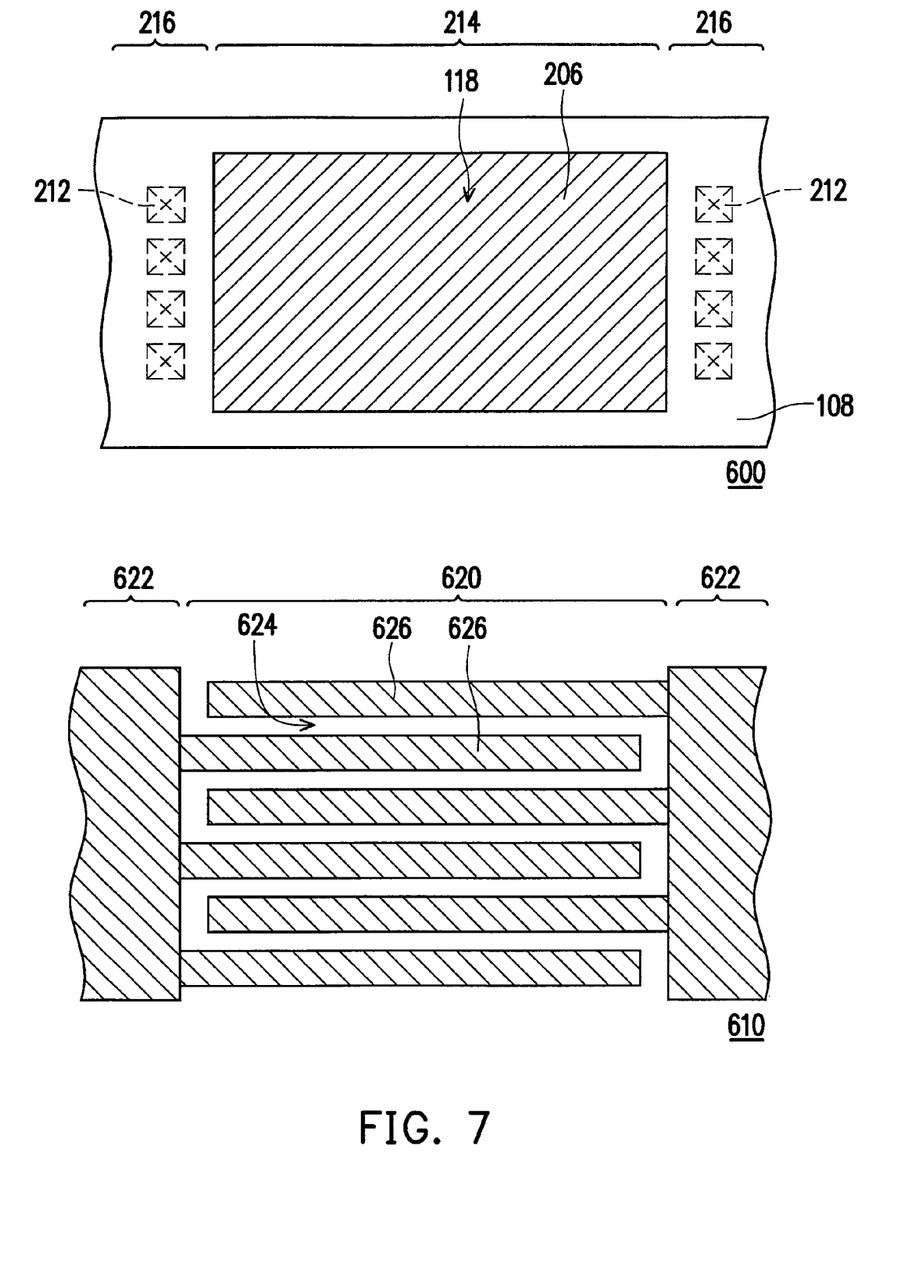
FIG. 7 is a schematic top view of a bond pad structure and a topmost metal layer according to the sixth embodiment of the present invention.

FIG. 7 is a schematic top view of a bond pad structure and a topmost metal layer according to the sixth embodiment of the present invention. Note that all the same parts in FIG. 7 to those in FIG. 3 are marked with the same notations and omitted to describe for simplicity.

Referring to FIGS. 3 and 7, the bond pad structure 600 of the sixth embodiment is different from the bond pad structure 200 of the second embodiment that each of the bar patterns 226 and the circuit layer 222 located at both sides of the bar patterns 226 are connected to each other in the supporting layer 220 of the topmost metal layer 210 of the second embodiment; but each of the bar patterns 626 and the circuit layer 622 located at at least one side of the bar patterns 626 are connected to each other in the supporting layer 620 of the topmost metal layer 610 of the sixth embodiment. In the other embodiments, the supporting layer 620 and the circuit layer 622 can be not connected to each other too. Besides, the parts of the bond pad structure 600 of the sixth embodiment and the similar parts of the bond pad structure 200 of the second embodiment have almost the same materials and functions, which are omitted to describe herein for simplicity.

Since the bond pad structure 600 of the sixth embodiment and the bond pad structure 200 of the second embodiment have the similar technical features; that is, the supporting layer 620 has at least a slot 624 within the supporting layer 620, therefore, the fracture of the bond pad 206 or the peeling problem of the bond pad 206 from the dielectric layer during a successive wiring process can be avoided, and moreover, the semiconductor structure under the bond pad 206 can be effectively protected as well.

Figure 8:
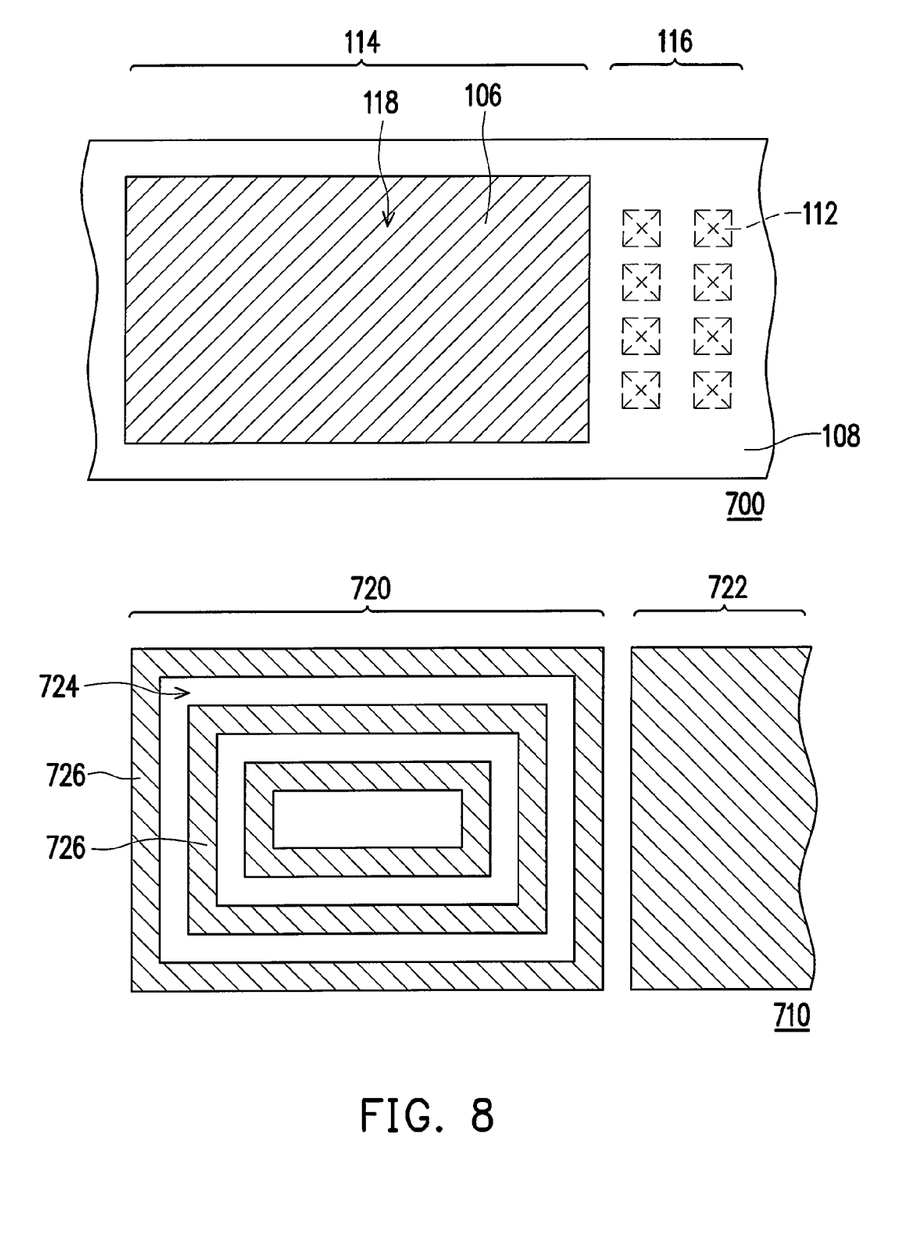
FIG. 8 is a schematic top view of a bond pad structure and a topmost metal layer according to the seventh embodiment of the present invention.

FIG. 8 is a schematic top view of a bond pad structure and a topmost metal layer according to the seventh embodiment of the present invention. Note that all the same parts in FIG. 8 to those in FIG. 1 are marked with the same notations and omitted to describe for simplicity.

Referring to FIGS. 1 and 8, the bond pad structure 700 of the seventh embodiment is different from the bond pad structure 100 of the first embodiment that the pattern of the supporting layer 120 of the topmost metal layer 110 in the first embodiment is at least two bar patterns 126 (for example, six parallel bar patterns 126 in FIG. 1); but the pattern of the supporting layer 720 of the topmost metal layer 710 of the seventh embodiment is at least two ring patterns 726 (for example, three ring patterns 726 in FIG. 5), and the ring patterns 726 are concentric ring patterns, for example. The supporting layer 720 of the topmost metal layer 710 is, for example, not electrically connected to the circuit layer 722. In the other embodiments, the supporting layer 720 and the circuit layer 722 can be connected to each other too. Besides, the parts of the bond pad structure 700 in the seventh embodiment and the similar parts of the bond pad structure 100 in the first embodiment have almost the same materials and functions, which are omitted to describe herein for simplicity.

Since the bond pad structure 700 of the seventh embodiment and the bond pad structure 100 of the first embodiment have the similar technical features; that is, the supporting layer 720 has at least a slot 724 within the supporting layer 720, therefore, the fracture of the bond pad 106 or the peeling problem of the bond pad 106 from the dielectric layer during a successive wiring process can be avoided, and moreover, the semiconductor structure under the bond pad 106 can be effectively protected as well.

In the above-mentioned first to seventh embodiments, the supporting layers are located under the whole bonding portion, for example. However, in the bonding portion, at least a portion of the bonding portion is a region for wiring, and the region is named a bonding region. Therefore, as long as the supporting layer is located under the bonding region, the effectiveness of the invention could be achieved. Thereinafter, an embodiment is provided to illustrate.

Figure 9:
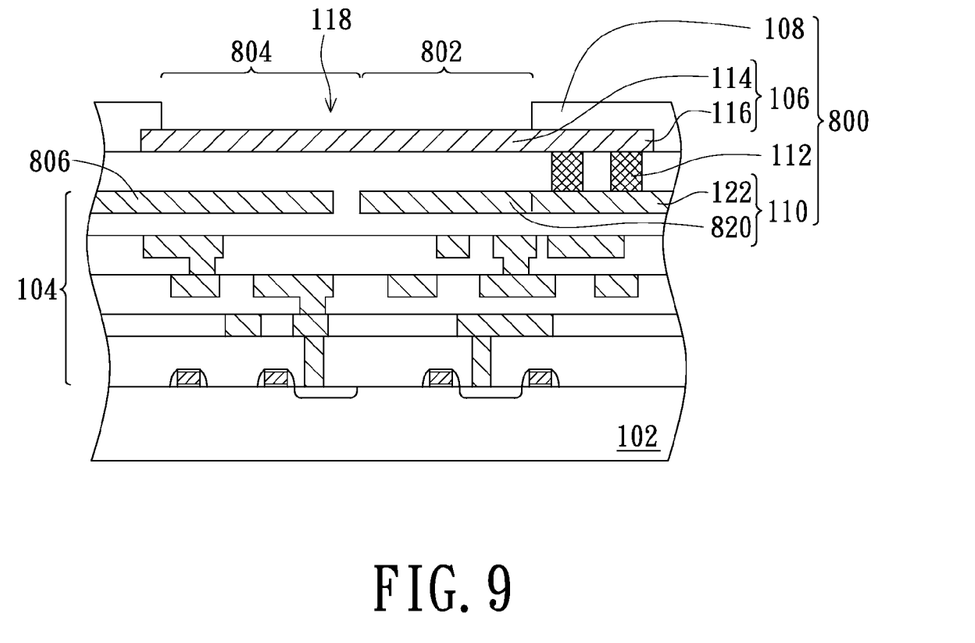
FIG. 9 is a cross-sectional diagram of a bond pad structure and a topmost metal layer according to the eighth embodiment of the present invention.

FIG. 9 is a cross-sectional diagram of a bond pad structure and a topmost metal layer according to the eighth embodiment of the present invention. Note that all the same parts in FIG. 9 to those in FIG. 2 are marked with the same notations and omitted to describe for simplicity.

Referring to FIGS. 2 and 9, the bond pad structure 800 of the eighth embodiment is different from the bond pad structure 100 of the first embodiment that the supporting layer 120 is located under the whole bonding portion 114 in the first embodiment; but the bonding portion 114 of the eighth embodiment is divided into a bonding region 802 and a non-bonding region 804, and the supporting layer 820 is only located under the bonding region 802 used for wiring. The pattern of the supporting layer 820 is anyone of the patterns of the supporting layers in the first to seventh embodiments. Besides, the parts of the bond pad structure 800 in the eighth embodiment and the similar parts of the bond pad structure 100 in the first embodiment have almost the same materials and functions, which are omitted to describe herein for simplicity.

Since the supporting layer 820 is only located under the bonding region 802, the space under the non-bonding region 804 could be used to fabricate the customized routing 806.

In summary, the above-described embodiments have at least following advantages:
  1. The bond pad structure provided by the present invention is capable of enhancing the wire pull strength of the bond pad and promoting the reliability thereof.
  2. The bond pad structure provided by the present invention is able to prevent the bond pad from being fractured or peeled from the dielectric layer during a wiring process.
  3. The bond pad structure provided by the present invention is able to protect the semiconductor structure under the bond pad during a wiring process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A bond pad structure, located over an active circuit structure, comprising:
  a bond pad;
  a passivation layer, covering the bond pad and having an opening, wherein the opening exposes a part of the bond pad; and
  a topmost metal layer in the active circuit structure, wherein a part of the topmost metal layer located under the opening is a supporting layer, wherein the supporting layer has at least a slot situated directly below the opening, and the topmost metal layer is electrically connected to the bond pad through a plurality of via plugs.

2. The bond pad structure according to claim 1, wherein the pattern of the supporting layer is at least two bar patterns.

3. The bond pad structure according to claim 2, wherein the bar patterns are parallel to each other.

4. The bond pad structure according to claim 2, wherein the bar patterns are connected to each other.

5. The bond pad structure according to claim 1, wherein the pattern of the supporting layer is a spiral pattern.

6. The bond pad structure according to claim 1, wherein the pattern of the supporting layer comprises a grillwork pattern.

7. The bond pad structure according to claim 1, wherein the pattern of the supporting layer is at least two ring patterns.

8. The bond pad structure according to claim 7, wherein the at least two ring patterns are concentric ring patterns.

9. A bond pad structure, located over an active circuit structure, comprising:
    a bond pad, comprising a bonding portion and a non-bonding portion, wherein at least a portion of the bonding portion is a bonding region;
    a passivation layer, covering the bond pad and having an opening, wherein the opening exposes the bonding portion of the bond pad;
    a topmost metal layer in the active circuit structure, comprising:
    a supporting layer, located under the bonding region of the bond pad and having at least a slot situated directly below the opening; and
    a circuit layer, located under the non-bonding portion of the bond pad, wherein the circuit layer and the supporting layer are connected to each other; and
    a plurality of via plugs, electrically connected to the bond pad and the circuit layer.

10. The bond pad structure according to claim 9, wherein the pattern of the supporting layer is at least two bar patterns.

11. The bond pad structure according to claim 10, wherein the bar patterns are parallel to each other.

12. The bond pad structure according to claim 10, wherein the bar patterns are connected to each other.

13. The bond pad structure according to claim 9, wherein the pattern of the supporting layer is a spiral pattern.

14. The bond pad structure according to claim 9, wherein the pattern of the supporting layer comprises a grillwork pattern.

15. The bond pad structure according to claim 9, wherein the pattern of the supporting layer is at least two ring patterns.

16. The bond pad structure according to claim 15, wherein the at least two ring patterns are concentric ring patterns.

17. The bond pad structure according to claim 9, wherein the supporting layer and the circuit layer are not connected to each other.

18. The bond pad structure according to claim 9, wherein the non-bonding portion is located at one side of the bonding portion.

19. The bond pad structure according to claim 9, wherein the non-bonding portion is located at both sides of the bonding portion.

20. The bond pad structure according to claim 19, wherein the pattern of the supporting layer is at least two bar patterns.

21. The bond pad structure according to claim 20, wherein each of the bar patterns and the circuit layer located at least one side of the bar patterns are connected to each other.

22. The bond pad structure according to claim 20, wherein an extending direction of the bar patterns and an extending direction of the bonding portion are parallel or perpendicular.

23. The bond pad structure according to claim 19, wherein the via plugs located at both sides of the bonding portion are symmetrical about the bonding portion.

24. The bond pad structure according to claim 19, wherein the via plugs located at both sides of the bonding portion are unsymmetrical about the bonding portion.

25. The bond pad structure according to claim 1, wherein a lengthwise direction of the slot is same to that of the supporting layer.

26. The bond pad structure according to claim 9, wherein a lengthwise direction of the slot is same to that of the supporting layer.

* * * * *